(12) United States Patent
Engelhardt et al.

(10) Patent No.: US 10,359,035 B2
(45) Date of Patent: *Jul. 23, 2019

(54) AIR AGITATOR ASSEMBLIES

(71) Applicant: GE Aviation Systems LLC, Grand Rapids, MI (US)

(72) Inventors: Michel Engelhardt, Woodbury, NY (US); Shushanna Rebecca Cherian-Brutus, Port Jefferson Station, NY (US)

(73) Assignee: GE AVIATION SYSTEMS LLC, Grand Rapids, MI (US)

( * ) Notice: Subject to any disclaimer, the term of this patent is extended or adjusted under 35 U.S.C. 154(b) by 1018 days.

This patent is subject to a terminal disclaimer.

(21) Appl. No.: 14/514,440

(22) Filed: Oct. 15, 2014

(65) Prior Publication Data

US 2016/0109195 A1 Apr. 21, 2016

(51) Int. Cl.
*G05D 23/00* (2006.01)
*F04B 43/04* (2006.01)
*F04F 7/00* (2006.01)
*F28F 13/12* (2006.01)
*H01L 23/467* (2006.01)

(52) U.S. Cl.
CPC ........... *F04B 43/04* (2013.01); *F04B 43/046* (2013.01); *F04F 7/00* (2013.01); *F28F 13/125* (2013.01); *H01L 23/467* (2013.01)

(58) Field of Classification Search
CPC ....... H01L 23/46; H01L 23/40; H01L 23/467; H01L 41/311; F28F 5/00; F28F 5/02; F28D 2021/0028; F28D 2021/0029
See application file for complete search history.

(56) References Cited

U.S. PATENT DOCUMENTS

| | | | |
|---|---|---|---|
| 5,914,856 A | 6/1999 | Morton et al. | |
| 6,722,581 B2 | 4/2004 | Saddoughi | |
| 7,688,583 B1 | 3/2010 | Arik et al. | |
| 7,742,299 B2 | 6/2010 | Sauciuc et al. | |
| 7,990,705 B2 | 8/2011 | Bult et al. | |
| 8,006,917 B2 | 8/2011 | Arik et al. | |
| 8,051,905 B2* | 11/2011 | Arik | H01L 23/4735 165/104.33 |
| 8,120,908 B2 | 2/2012 | Ank et al. | |
| 8,136,767 B2 | 3/2012 | Cueman et al. | |
| 8,308,078 B2 | 11/2012 | Arik et al. | |
| 8,548,289 B2* | 10/2013 | Selbrede | G02B 6/0053 359/291 |
| 8,783,893 B1* | 7/2014 | Seurin | H01S 5/4018 362/157 |

(Continued)

OTHER PUBLICATIONS

A U.S. Non-Final Office Action issued in connection with related U.S. Appl. No. 14/514,436 dated Apr. 10, 2017.

*Primary Examiner* — Keith M Raymond
*Assistant Examiner* — Kamran Tavakoldavani
(74) *Attorney, Agent, or Firm* — General Electric Company; William Scott Andes

(57) ABSTRACT

An air agitator assembly for use with a heat-emitting object, where the air agitator assembly includes a perforated flexible plate confronting and spaced from a portion of the heat-emitting object to define an air space there between and at least one piezoelectric structure located on the perforated flexible plate and operably coupled to a power source.

20 Claims, 5 Drawing Sheets

(56) References Cited

U.S. PATENT DOCUMENTS

| | | | |
|---|---|---|---|
| 2006/0185822 A1* | 8/2006 | Glezer | F04F 7/00 165/80.3 |
| 2010/0001090 A1* | 1/2010 | Neergaard | B05B 17/0638 239/4 |
| 2010/0053891 A1* | 3/2010 | Arik | H01L 23/467 361/692 |
| 2010/0054973 A1 | 3/2010 | Arik et al. | |
| 2010/0320362 A1* | 12/2010 | Alpert | H01S 3/083 250/200 |
| 2010/0320877 A1* | 12/2010 | Onitsuka | H01L 23/055 310/365 |
| 2011/0204409 A1* | 8/2011 | Sung | H05K 1/0373 257/99 |
| 2011/0316416 A1 | 12/2011 | Han et al. | |
| 2012/0018537 A1 | 1/2012 | Arik et al. | |
| 2012/0032876 A1* | 2/2012 | Tabe | H04B 1/3838 345/156 |
| 2012/0170216 A1 | 7/2012 | Arik et al. | |
| 2013/0306300 A1* | 11/2013 | Welsch | F01P 7/048 165/287 |
| 2016/0109195 A1 | 4/2016 | Engelhardt et al. | |
| 2016/0113145 A1* | 4/2016 | Engelhardt | H05K 7/20172 165/287 |

* cited by examiner

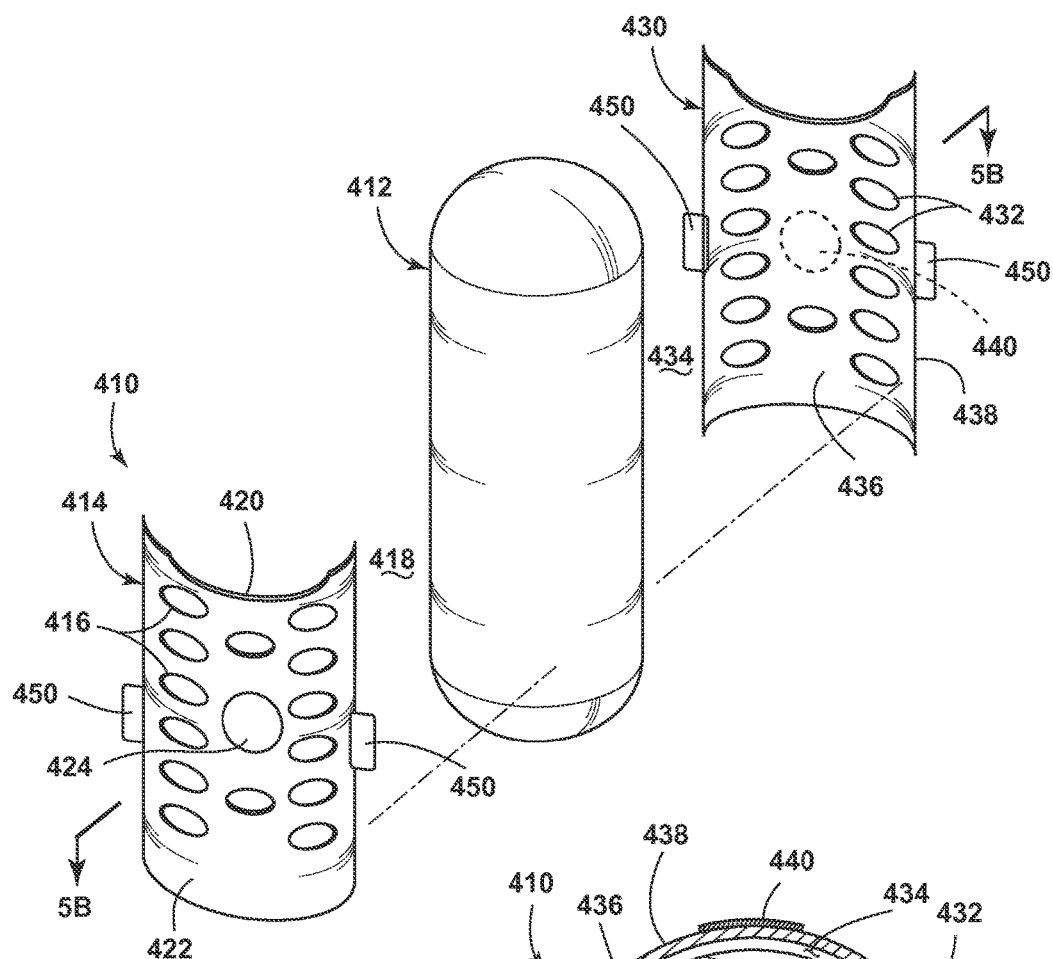
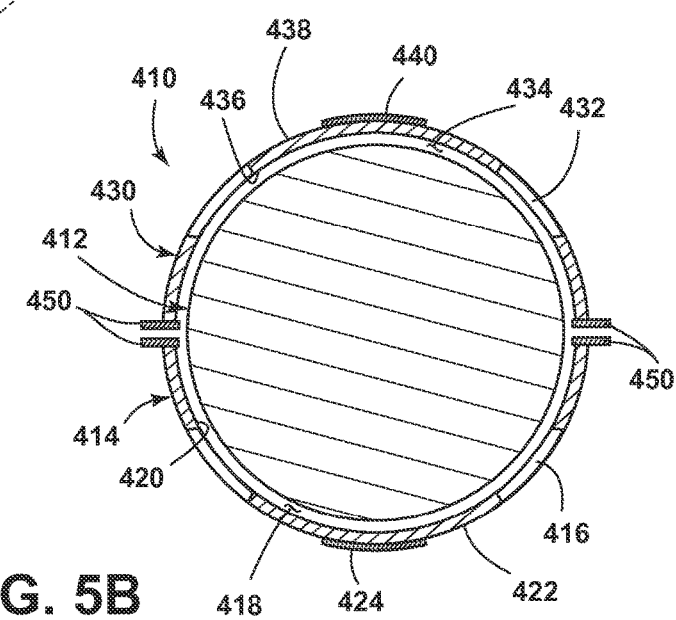
FIG. 5A
FIG. 5B

AIR AGITATOR ASSEMBLIES

CROSS-REFERENCE TO RELATED APPLICATIONS

This application is related to patent application Ser. No. 14/514,136, entitled AIR AGITATOR ASSEMBLIES, filed concurrently herewith.

BACKGROUND OF THE INVENTION

Contemporary high-power-dissipating electronics produce heat that requires thermal management to maintain the electronics at a designed working temperature range. Heat must be removed from the electronic device to improve reliability and prevent premature failure of the electronics. Cooling techniques may be used to minimize hot spots.

BRIEF DESCRIPTION OF THE INVENTION

In one aspect, an embodiment of the invention relates to an air agitator assembly for use with a heat-emitting object, including a perforated flexible plate having a thermally absorbing first side confronting and spaced from a portion of the heat-emitting object to define an air space there between and a second side opposite the first side and at least one piezoelectric structure located on the perforated flexible plate and operably coupled to a power source wherein heat emitted from the heat-emitting object is absorbed by the first side and actuation of the at least one piezoelectric structure results in movement of the perforated flexible plate to move the volume of the air located between the hot source and the agitator assembly with the local ambient air.

BRIEF DESCRIPTION OF THE DRAWINGS

In the drawings:

FIG. 5A is an exploded perspective view of an air agitator assembly according to another embodiment.

FIG. 5B is a cross-sectional view of the assembled air agitator assembly of FIG. 5A.

DESCRIPTION OF EMBODIMENTS OF THE INVENTION

Figure 1A:
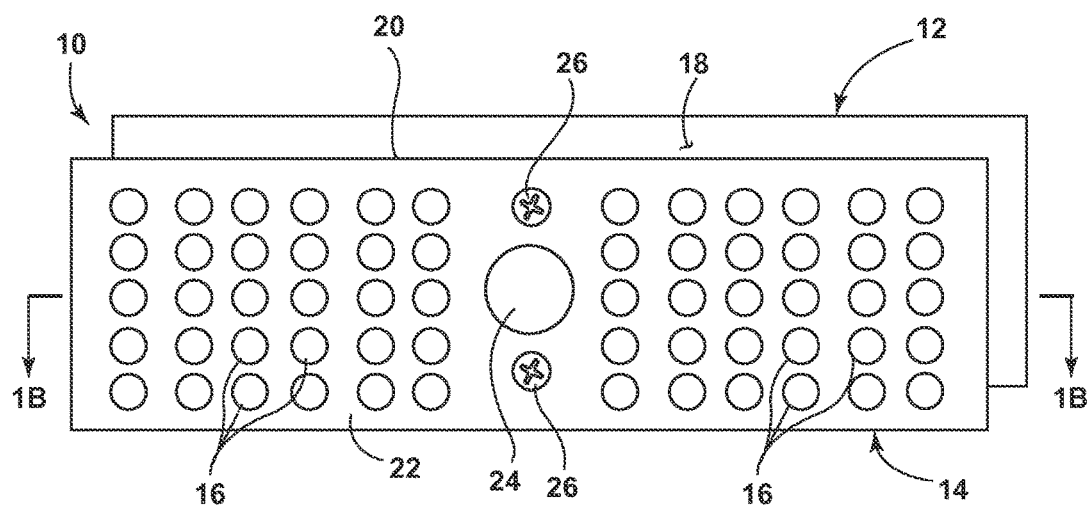
FIGS. 1A-1B schematically illustrate an air agitator assembly according to an embodiment of the invention.

FIG. 1A illustrates an air agitator assembly 10 for use with a heat-emitting object 12. The heat-emitting object 12 may be any heat-emitting object including any electronic heat-emitting component that requires thermal management such as a microprocessor, high heat flux Printed Circuit Boards (PCBs), capacitors electronics including MOSFETs, and any other device that needs cooling. In the accompanying FIGS. 1 through 4, the heat-emitting object 12 has been illustrated as a PCB for illustrative purposes only. The agitator assembly 10 may be used with airborne, shipboard, and ground based electronics or any heat dissipating plate and device.

A perforated flexible plate 14 may be included in the air agitator assembly 10 and may be spaced apart from the heat-emitting object 12 and disposed in a generally confronting relationship with the heat-emitting object 12. The perforated flexible plate has been shown partially exploded and partially offset from the heat-emitting object 12 for illustrative purposes. The perforated flexible plate 14 may be formed from any suitable flexible material including aluminum, copper, stainless steel, composite, etc. While the term plate is used, it will be understood that the perforated flexible plate 14 need not have a planar shape and may have any suitable shape including that of a different geometrical shape including a circle or non-standard-geometrical shape. Further, it will be understood that the perforated flexible plate 14 may be of any suitable thickness including that it may have a varied thickness. Perforations 16 in the perforated flexible plate 14 may take any suitable shape and size. Any number of perforations 16 may be included and such perforations 16 may be spaced from each other in any suitable manner.

Figure 1B:
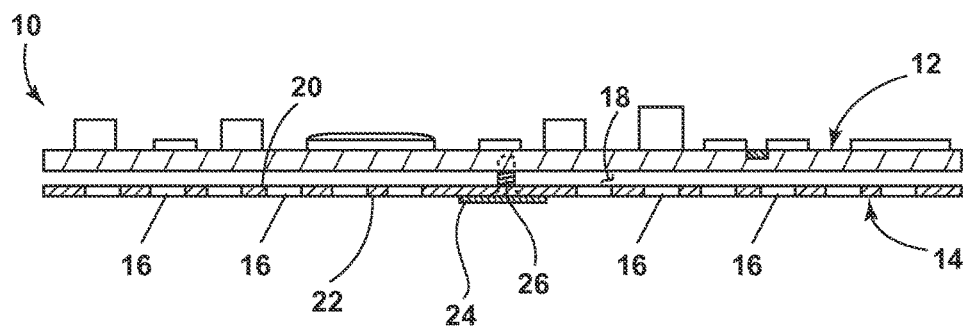

A first side 20 of the perforated flexible plate 14 is illustrated more clearly in FIG. 1B as the side confronting and spaced from a portion of the heat-emitting object 12 to define an air space 18 there between. The first side 20 is thermally absorbing via radiation heat transfer. More specifically, the first side 20 may have an absorptivity that is close to 1.0. By way of non-limiting example, the first side 20 may have an absorption value equal to or greater than 0.95. The absorptivity may be achieved in any suitable manner including having the first side 20 be black in color. As an example, the black color in the paint mix is a polyurethane paint doped with carbon black to obtain the desired high emissivity value.

Conversely, the second side 22, which is opposite the first side 20, of the perforated flexible plate 14 may include a thermally reflective surface such that it is configured to minimize the absorption of heat via radiation. More specifically, the second side 22 may have a reflectivity that is close to one and an absorptivity that is close to 0.0. By way of non-limiting example, the second side 22 may have an absorption value equal to or less than 0.1 and a reflectivity value greater than 0.95. The reflectivity may be achieved in any suitable manner including by having the second side 22 be shiny and light in color. Such a radiation coating may be applied to the perforated flexible plate 14 to minimize the radiative heat transfer from hotter objects and to maximize the heat dissipation from the second surface 22. It is understood that the second surface 22 can have a tailorable emissivity and reflectivity depending on the view factor between hot and colder components within the packaged enclosure.

At least one piezoelectric structure 24, for example a piezoelectric crystal, may be located on the perforated flexible plate 14. In the illustrated example, the piezoelectric structure 24 is located at the center of the perforated flexible plate 14. This need not be the case, and at least one piezoelectric structure 24 may be located elsewhere. The piezoelectric structure 24 may be operably coupled to suitable power sources through connections (not shown). For example, a controllable electric source (not shown) may be utilized such that an alternating voltage of the desired magnitude and frequency may be applied to the piezoelectric structure 24. If multiple piezoelectric structures 24 are utilized, they may be spaced from each other or stacked.

The air agitator assembly 10 may be mounted to the heat-emitting object 12. By way of non-limiting example, the perforated flexible plate 14 is illustrated as being mounted to the heat-emitting object 12 at its center with fasteners 26 in the form of screws. Alternatively, the air agitator assembly 10 may be mounted to a housing or other structure such that it is spaced from the heat-emitting object 12 such that the air agitator assembly 10 is mounted next to the heat-emitting object 12. By way of non-limiting example, it is contemplated that the two may be spaced closely such as within approximately 0.25 to 0.5 inches apart.

During operation, heat emitted from the heat-emitting object 12 is absorbed by the thermally absorbing first side 20 of the perforated flexible plate 14. Such heat travels through the perforated flexible plate 14 by way of conduction and may radiate from the second side 22 into the surrounding environment. Because the perforated flexible plate 14 has one side that is highly thermally absorbing and the other highly reflective, greater heat transfer rates are achieved. It will also be understood that the highly reflective side can be tailored to a highly absorbing side depending on the view factor with cooler components within the enclosure.

Further, at least one piezoelectric structure 24 may be actuated and this results in movement of the perforated flexible plate 14 to move air within the volume of the air space 18. The movement of the perforated flexible plate 14 may cause the air to circulate and agitate. Such agitation movement allows for an increase in the coefficient of convection heat transfer and the circulation allows for cooling of the air agitator assembly 10 that has absorbed part of the heat from the heat-emitting object 12 via radiation heat transfer. More specifically, when a voltage is applied to at least one piezoelectric structure 24 ends of the perforated flexible plate 14 move upwards. When a voltage of opposite polarity is applied, ends of the perforated flexible plate 14 move in the opposite direction. The actuation of the piezoelectric structure 24 causes ends of the perforated flexible plate 14 to flap.

In this manner, the piezoelectric structure 24 converts electrical energy into mechanical work for the perforated flexible plate 14 to oscillate. The perforated flexible plate 14 may be caused to oscillate or flap at any suitable speed including, by way of non-limiting example, at frequencies of approximately 140 Hz. As the perforated flexible plate 14 oscillates, the local boundary layer near the heat-emitting object 12 is agitated and disturbed. The disturbed boundary layer becomes an effective convective heat transfer medium. As the perforated flexible plate 14 oscillates, the boundary layer air that is located next to the heat-emitting object 12 is forced to continuously mix with the cooler air in the surrounding environment due to the air movement in-and-out of the perforations 16 that are located on the perforated flexible plate 14. Further, the second side 22 of the perforated flexible plate 14 reflects heat from other packaged electronic devices that are in view of the heat-emitting object 12 and hotter than the heat-emitting object 12.

Figure 2A:
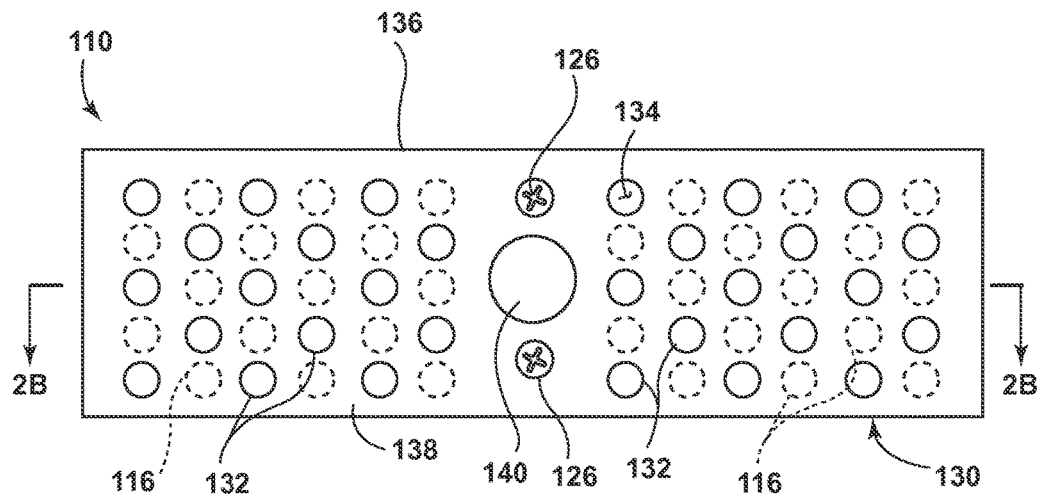
FIGS. 2A-2B schematically illustrate an air agitator assembly according to another embodiment of the invention.
Figure 2B:
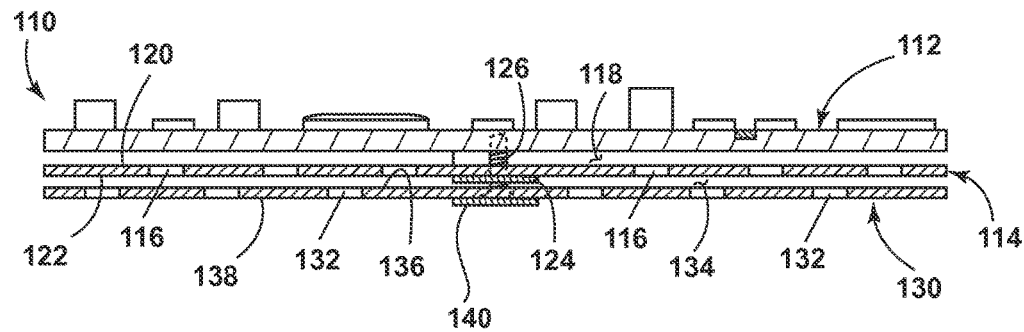

By way of further non-limiting example, FIGS. 2A-2B illustrate an alternative air agitator assembly 110 according to a second embodiment of the invention. The air agitator assembly 110 is similar to the air agitator assembly 10 previously described and therefore, like parts will be identified with like numerals increased by 100, with it being understood that the description of the like parts of the air agitator assembly 10 applies to the air agitator assembly 110, unless otherwise noted.

One difference is that the air agitator assembly 110 includes a second air agitator having a second perforated flexible plate 130 with perforations 132. The second perforated flexible plate 130 is in a confronting and spaced relationship with the second side of the first perforated flexible plate 114 to define an air space 134 there between. The second perforated flexible plate 130 is similar to the first and also includes a thermally absorbing first side 136 and a reflective second side 138 opposite the first side 136 and at least one piezoelectric structure 140 located on the second perforated flexible plate 130. The first perforated flexible plate 114 and the second perforated flexible plate 130 may be arranged in parallel such that they may obtain a desired effective radiation heat transfer. Although this need not be the case, the first perforated flexible plate 114 and the second perforated flexible plate 130 have been illustrated as being arranged such that perforations 116 and 132 in each perforated flexible plate are offset. While only two plates have been illustrated, it is contemplated that any number of plates may be arranged in such a parallel relationship. The first perforated flexible plate 114 and the second perforated flexible plate 130 may be placed at close distance from one another.

The air agitator assembly 110 works similarly to the air agitator assembly 10 described above including that heat emitting from the heat-emitting object 112 is absorbed by the first side 120 of the first perforated flexible plate 114 and heat emitting from the second side 122 of the first perforated flexible plate 114 is absorbed by the first side 136 of the second perforated flexible plate 130. Further, actuation of piezoelectric structures 124 and 140 results in movement of the corresponding first perforated flexible plate 114 and the corresponding second perforated flexible plate 130 to draw air in, push out the drawn in air such that the heat-emitting object 112 is cooled by the airflows and air movement created. It is contemplated that the piezoelectric structures 124, 140 of the first perforated flexible plate 114 and the second perforated flexible plate 130, respectively, are configured to be actuated simultaneously and may utilize the same power source and/or controller. Alternatively, they may be actuated separately and may utilize separate power sources and/or controllers.

Both the first perforated flexible plate 114 and the second perforated flexible plate 130 act to disturb the boundary layer of air along the heat-emitting object 112. Further, both the first perforated flexible plate 114 and the second perforated flexible plate 130 act as a radiation heat shield. Because the perforations 116 and 132 are offset they occult the view factor between the heat-emitting object 112 and any higher heat-emitting components that are located nearby.

Figure 3:
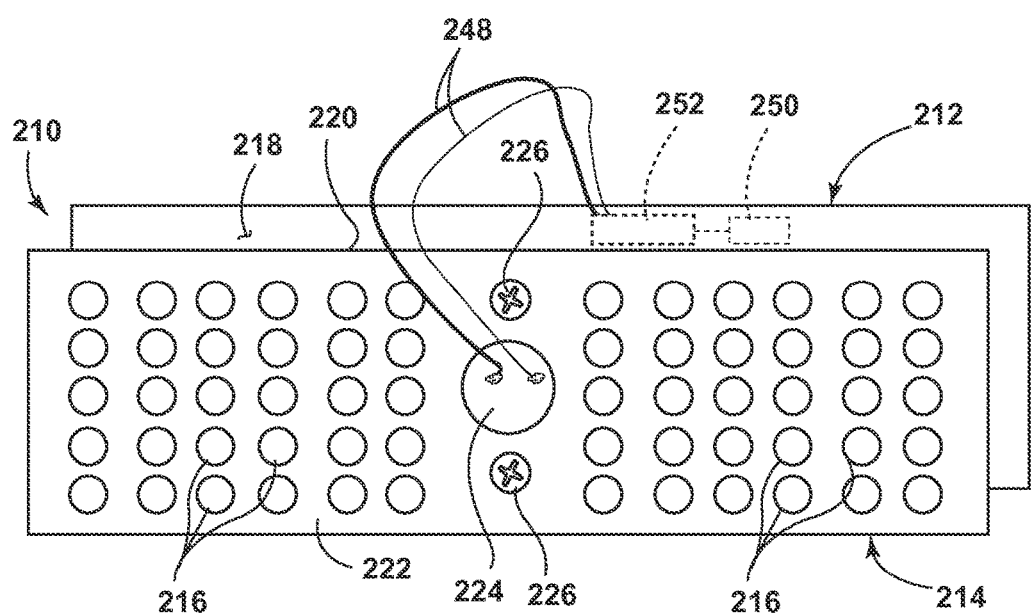
FIG. 3 is a partially exploded view of an air agitator assembly according to yet another embodiment of the invention.

By way of further non-limiting example, FIG. 3 illustrate an alternative air agitator assembly 210 according to a third embodiment of the invention. The air agitator assembly 210 is similar to the air agitator assembly 10 previously described and therefore, like parts will be identified with like numerals increased by 200, with it being understood that the description of the like parts of the air agitator assembly 10 applies to the air agitator assembly 210, unless otherwise noted.

One difference is that connections 248 are illustrated as coupling the piezoelectric structure 224 to a power source 252 located directly on the perforated flexible plate 214. Further, a controller 250 is illustrated as being included on the perforated flexible plate 214. The controller 250 may be configured to control actuation of the power source 252 and therefore the piezoelectric structure 224. The controller 250 may be any suitable type of controller including a Proportional Integral Differential (PID) controller or an on/off controller. During operation, the controller 250 may allow the air agitator assembly 210 to turn-off during low temperature operation, such as by way of example below 20° C., to increase the reliability of the air agitator assembly 210.

Figure 4:
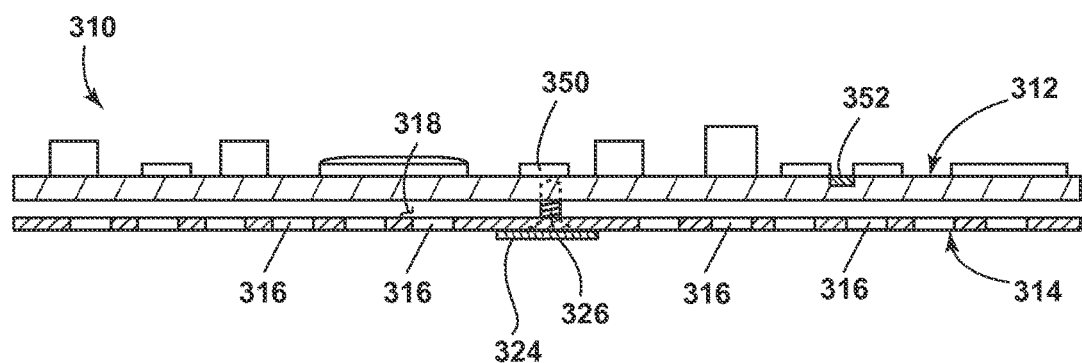
FIG. 4 is a cross-sectional view of an air agitator assembly according to another embodiment of the invention.

By way of further non-limiting example, FIG. 4 illustrates an alternative air agitator assembly 310 according to a fourth embodiment of the invention. The air agitator assembly 310 is similar to the air agitator assembly 210 previously described and therefore, like parts will be identified with like numerals increased by 100, with it being understood that the description of the like parts of the air agitator assembly 210 applies to the air agitator assembly 310, unless otherwise noted.

One difference is that power source for the piezoelectric structure 324 is not illustrated on the heat-emitting object 312. While it may be located on the heat-emitting object 312 it may also be located elsewhere. Further, while the controller 350 has been illustrated as being coupled to the heat-emitting object 312 it may also be located elsewhere. Another difference is that a temperature-measuring device 352 has been illustrated as being included on the heat-emitting object 312. Such a temperature-measuring device 352 may be considered a part of the air agitator assembly 310 regardless of its location. The temperature-measuring device 352 may provide a temperature signal to the controller 350 such that the air agitator assembly 310 may be controlled based on a temperature of the heat-emitting device 312 or the air surrounding it. Any suitable temperature-measuring device 352 may be utilized including a thermocouple.

Again the controller 350 may be any suitable type of controller. By way of non-limiting example, when an on/off controller is used with the integrated temperature-measuring device 352, the piezoelectric structure 324 may be activated when the allowable hot temperature is reached. For example, such a hot temperature may be, for exemplary purposes, 70° C. Alternatively, when the temperature is detected and sent to the controller 350 it is between a set hysteresis loop, as an example 20° C. to 70° C., the piezoelectric structure 324 is controlled to be either on or off. In this mode, the air agitator assembly 310 is considered in the hysteresis hot or cold mode, respectively. The hysteresis mode occurs either during a decrease in temperature from its turn-on set point or an increase in temperature from its turn-offset point. When the temperature is below it lowest set point, the power to the piezoelectric structure 324 is off. If a PID type controller is used, the hysteresis loop may be replaced by a fine temperature control with a higher tolerance.

By way of further non-limiting example, FIGS. 5A-5B illustrate an alternative air agitator assembly 410 according to a fifth embodiment of the invention. The air agitator assembly 410 is similar to the air agitator assembly 10 previously described and therefore, like parts will be identified with like numerals increased by 400, with it being understood that the description of the like parts of the air agitator assembly 10 applies to the air agitator assembly 410, unless otherwise noted.

One difference is that the air agitator assembly 410 is illustrated as being used with a heat-emitting object 412 that has a contour (i.e. is not flat). For example, such a heat-emitting object 412 may be a capacitor. Further, while the perforated flexible structure 414 may include a thermally absorbing first side 420 confronting and spaced from a portion of the heat-emitting object 412 to define an air space 418 there between and a reflective second side 422 unlike the earlier embodiments the perforated flexible structure 414 has at least a portion of the first side 420 that has a contour that matches a contour of a corresponding portion of the heat-emitting object 412. In the illustrated example, the first side 420 is rounded to better match the cylindrical shape of the heat-emitting object 412. It will be understood that the contoured perforated flexible structure 414 may have any suitable shape and may be contoured in any suitable manner depending on the shape of the heat-emitting object. For example, the flexible structure may merely be shaped or bent plate or structure. Alternatively, it is contemplated that a thickness of the flexible structure may be varied such that the first side 420 of the perforated flexible structure 414 has a contour that matches the contour of the corresponding portion of the heat-emitting object 412.

Further, the air agitator assembly 410 includes a second perforated flexible structure 430 with perforations 432. The second perforated flexible structure 430 is in a confronting and spaced relationship with a second side of the heat-emitting object 412 to define an air space 434 there between. The second perforated flexible structure 430 is similar to the first perforated flexible structure 414 and also includes a thermally absorbing first side 436 and a reflective second side 438 opposite the first side 436 and at least one piezoelectric structure 440 located on the second perforated flexible structure 430. The first perforated flexible structure 414 and the second perforated flexible structure 430 may be joined via portions 450 including that a screw of other fastener may be utilized to fasten the portions 450 together. As illustrated in FIG. 5B, the first perforated flexible structure 414 and the second perforated flexible structure 430 may be mounted together such that they do not touch the heat-emitting object 412.

The air agitator assembly 410 works similarly to the air agitator assembly 10 described above including that heat emitting from the heat-emitting object 412 is absorbed by the first side 420 of the first perforated flexible structure 414 and the first side 436 of the second perforated flexible structure 430. Further, actuation of piezoelectric structures 424 and 440 results in movement of the corresponding first perforated flexible structure 414 and the corresponding second perforated flexible structure 430 to create air movement such that the heat-emitting object 112 is cooled by the airflows and air movement created. It is contemplated that the piezoelectric structures 424, 440 of the first perforated flexible structure 414 and the second perforated flexible structure 430, respectively, are configured to be actuated simultaneously or in series or based on the same or different detected temperatures. Further, they may utilize the same power source and/or controller or utilize separate power sources and/or controllers.

In this manner both the first perforated flexible structure 414 and the second perforated flexible structure 430 act to disturb the boundary layer of air around the heat-emitting object 412. Further, both the first perforated flexible structure 414 and the second perforated flexible structure 430 act as a radiation heat shield. It will be understood that an air agitator assembly having a contoured may be utilized with any number of perforated flexible structures over any number of sides of any heat-emitting object. Including that only a single perforated flexible structure may be utilized. Further still this may include utilizing perforated flexible structures in parallel with each other as disclosed in embodiments above. Further still, the air agitator assembly 410 may be used with one or more controllers, power sources, and/or temperature sensors.

The embodiments described above provide a variety of benefits including that such air agitator assemblies solve the thermal management problem of cooling electronic devices with high power dissipations, with local hot spots, or electronic components that require a uniform temperature distribution. The effective convection, provided by the oscillation of the plate and the perforations, and radiation, provided by the highly absorbing and reflective surfaces, heat transfer coefficient is expected to be approximately five times greater than natural convection. The above-described embodiments couple convection and radiation heat transfer to provide better cooling. Further, the above-described embodiments are easy to manufacture, have low electrical draw, low volume, are lightweight, and increase component reliability. Typically, standard fans are used for convection cooling in aircrafts; however, they are heavier and at times the air circulation from fans is blocked due to the high-density packaging. The above-described embodiments significantly improve cooling because the air movement is near the boundary layer of the heat-emitting object as opposed to having the air travel through a tortuous path to get to the object. Further still, depending on the attachment method, the air agitator assembly may provide additional structural integrity to the component to be cooled while it is under vibration and shock environments.

To the extent not already described, the different features and structures of the various embodiments may be used in combination with each other as desired. Some features may not be illustrated in all of the embodiments, but may be implemented if desired. Thus, the various features of the different embodiments may be mixed and matched as desired to form new embodiments, whether or not the new embodiments are expressly described. All combinations or permutations of features described herein are covered by this disclosure.

This written description uses examples to disclose the invention, including the best implementation, to enable any person skilled in the art to practice the invention, including making and using the devices or systems described and performing any incorporated methods presented. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An air agitator assembly for use with a heat-emitting object, comprising:
   a perforated flexible plate having a thermally absorbing first side confronting and spaced from a portion of the heat-emitting object to define an air space there between and a second side opposite the first side, wherein the first side has an absorption value greater than 0.95; and
   at least one piezoelectric structure located on the perforated flexible plate and operably coupled to a power source,
   wherein heat emitted from the heat-emitting object is absorbed by the first side and actuation of the at least one piezoelectric structure results in movement of the perforated flexible plate to move a volume of air located between the heat-emitting object and the agitator assembly with local ambient air.

2. The air agitator assembly of claim 1, wherein the at least one piezoelectric structure is located at a center of the perforated flexible plate.

3. The air agitator assembly of claim 2, wherein the perforated flexible plate is mounted to the heat-emitting object and actuation of the at least one piezoelectric structure causes ends of the perforated flexible plate to flap.

4. The air agitator assembly of claim 1, further comprising a controller configured to control actuation of the at least one piezoelectric structure.

5. The air agitator assembly of claim 4, further comprising a temperature-measuring device providing a temperature signal to the controller.

6. The air agitator assembly of claim 5, wherein the controller is a Proportional Integral Differential (PID) controller or an on/off controller.

7. The air agitator assembly of claim 1, wherein the air space is defined by coupling the perforated flexible structure to the heat-emitting object using a fastener.

8. The air agitator assembly of claim 1, wherein the air space is defined by coupling the perforated flexible structure to the heat-emitting object using a fastener.

9. An air agitator assembly for use with a heat-emitting object, comprising:
   a perforated flexible plate having a thermally absorbing first side confronting and spaced from a portion of the heat-emitting object to define an air space there between and a second side opposite the first side, wherein the second side comprises a thermally reflective surface configured to transfer heat via radiation and wherein the second side has a reflectivity value greater than 0.95 or wherein the second side has an absorption value less than 0.1; and
   at least one piezoelectric structure located on the perforated flexible plate and operably coupled to a power source,
   wherein heat emitted from the heat-emitting object is absorbed by the first side and actuation of the at least one piezoelectric structure results in movement of the perforated flexible plate to move a volume of air located between the heat-emitting object and the agitator assembly with local ambient air.

10. The air agitator assembly of claim 9, wherein the first side has an absorption value greater than 0.95.

11. The air agitator assembly of claim 9, wherein the at least one piezoelectric structure is located at a center of the perforated flexible plate.

12. The air agitator assembly of claim 11, wherein the perforated flexible plate is mounted to the heat-emitting object and actuation of the at least one piezoelectric structure causes ends of the perforated flexible plate to flap.

13. The air agitator assembly of claim 9, further comprising a controller configured to control actuation of the at least one piezoelectric structure.

14. The air agitator assembly of claim 13, further comprising a temperature-measuring device providing a temperature signal to the controller.

15. An air agitator assembly for use with a heat-emitting object, comprising:
   a perforated flexible plate having a thermally absorbing first side confronting and spaced from a portion of the heat-emitting object to define an air space there between and a second side opposite the first side; and
   at least one piezoelectric structure located at a center of the perforated flexible plate and operably coupled to a power source,
   wherein heat emitted from the heat-emitting object is absorbed by the first side and actuation of the at least one piezoelectric structure results in movement of the perforated flexible plate to move a volume of air located between the heat-emitting object and the agitator assembly with local ambient air.

16. The air agitator assembly of claim 15, wherein the perforated flexible plate is mounted to the heat-emitting object and actuation of the at least one piezoelectric structure causes ends of the perforated flexible plate to flap.

17. An air agitator assembly for use with a heat-emitting object, comprising:
   a perforated flexible plate having a thermally absorbing first side confronting and spaced from a portion of the heat-emitting object to define an air space there between and a second side opposite the first side;
   at least one piezoelectric structure located on the perforated flexible plate and operably coupled to a power source;
   a controller configured to control actuation of the at least one piezoelectric structure; and
   a temperature-measuring device providing a temperature signal to the controller,
   wherein heat emitted from the heat-emitting object is absorbed by the first side and actuation of the at least one piezoelectric structure results in movement of the perforated flexible plate to move a volume of air located between the heat-emitting object and the agitator assembly with local ambient air.

18. The air agitator assembly of claim 17, wherein the controller is a Proportional Integral Differential (PID) controller or an on/off controller.

19. The air agitator assembly of claim 17, wherein the air space is defined by coupling the perforated flexible structure to the heat-emitting object using a fastener.

20. An air agitator assembly for use with a heat-emitting object, comprising:
   a perforated flexible plate having a thermally absorbing first side confronting and spaced from a portion of the heat-emitting object to define an air space there between and a second side opposite the first side wherein the air space is defined by coupling the perforated flexible structure to the heat-emitting object using a fastener; and
   at least one piezoelectric structure located on the perforated flexible plate and operably coupled to a power source,
   wherein heat emitted from the heat-emitting object is absorbed by the first side and actuation of the at least one piezoelectric structure results in movement of the perforated flexible plate to move a volume of air located between the heat-emitting object and the agitator assembly with local ambient air.

* * * * *